(12) United States Patent
Morris

(10) Patent No.: US 6,229,956 B1
(45) Date of Patent: May 8, 2001

(54) FLASH EVAPORATOR VESSEL

(75) Inventor: Joseph M. Morris, Lincoln, RI (US)

(73) Assignee: Advanced Ceramics Corporation, Lakewood, OH (US)

( * ) Notice: Subject to any disclaimer, the term of this patent is extended or adjusted under 35 U.S.C. 154(b) by 0 days.

(21) Appl. No.: 09/533,003

(22) Filed: Mar. 22, 2000

(51) Int. Cl.[7] .............................. B01D 7/00; C23C 16/00; F27B 14/10
(52) U.S. Cl. ......................... 392/389; 118/726; 432/262
(58) Field of Search .................................. 392/386, 388, 392/389; 118/726, 727; 432/262, 263, 264, 265

(56) References Cited

U.S. PATENT DOCUMENTS

| | | | | |
|---|---|---|---|---|
| 3,452,970 | * | 7/1969 | Mayer et al. ........................ | 432/265 |
| 3,541,301 | * | 11/1970 | Gallet .................................... | 392/389 |
| 3,636,305 | * | 1/1972 | Passmore ............................. | 392/389 |
| 4,112,290 | * | 9/1978 | Nakajima et al. ................... | 392/389 |
| 4,264,803 | * | 4/1981 | Shinko ................................. | 392/389 |
| 4,446,357 | * | 5/1984 | Barshter .............................. | 432/264 |
| 5,239,612 | * | 8/1993 | Morris ................................. | 392/389 |

* cited by examiner

Primary Examiner—Sang Paik
(74) Attorney, Agent, or Firm—Anderson, Kill & Olick P.C.

(57) ABSTRACT

The resistant heated flash evaporator of the present invention is designed for flash evaporating a metal charge in a confined area and is substantially horse shoe in geometrical configuration having opposite ends and an upper section with the upper section having a recessed cavity adapted to receive the metal charge and having two leg sections extending downwardly from the opposite ends of the vessel. The cross sectional dimension of each leg section nearest the recessed cavity is substantially smaller in size than the cross sectional dimension of each leg section as it recedes therefrom so as to form a large open area below the recessed cavity.

8 Claims, 1 Drawing Sheet

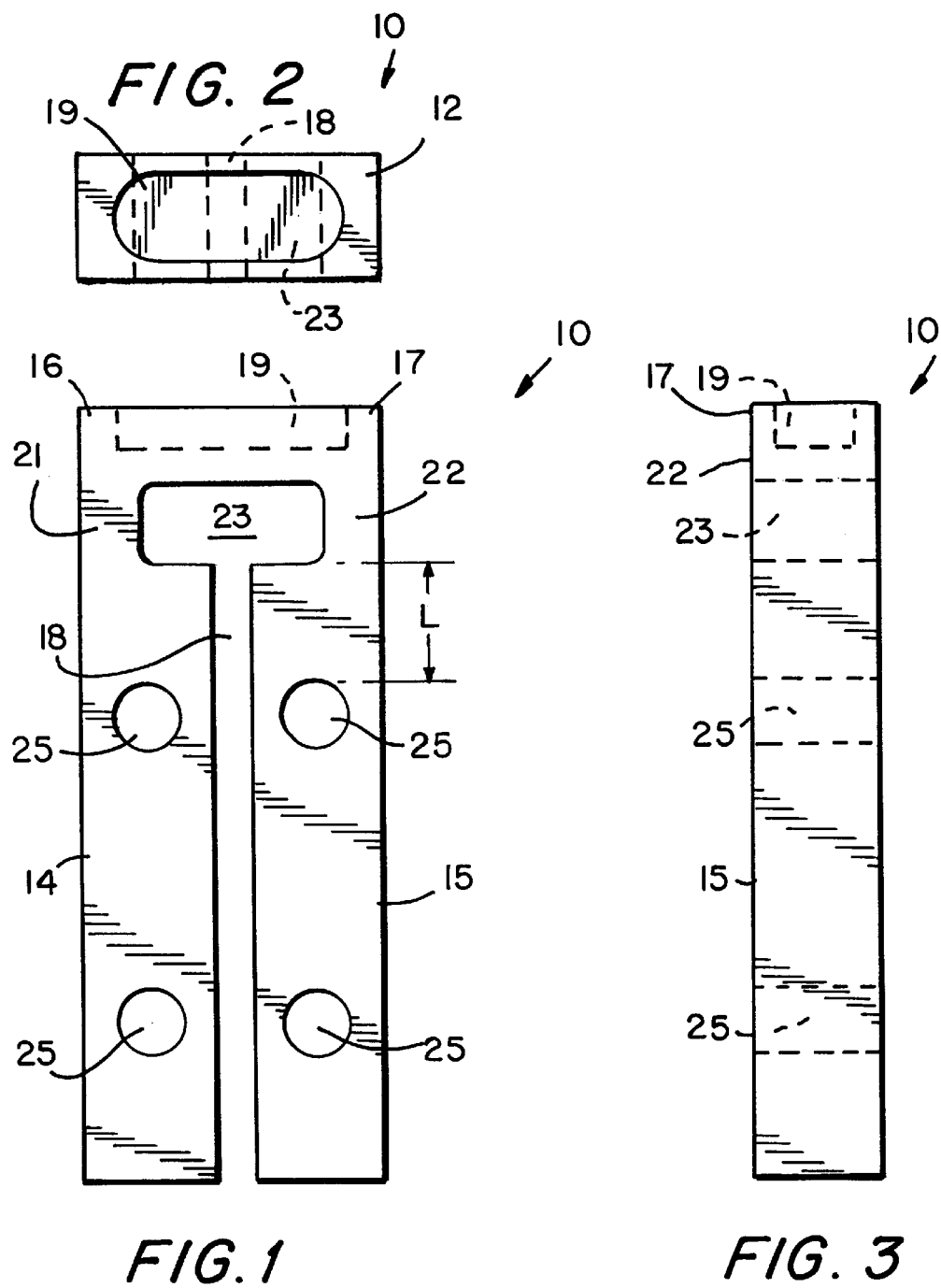

FLASH EVAPORATOR VESSEL

FIELD OF INVENTION

This invention relates to a flash evaporator vessel for vaporizing metals particularly aluminum and more specifically to a resistance heated flash evaporator vessel for vaporizing a source of aluminum metal in a confined area such as within the neck of a Projection Ray Tube ("PRT").

BACKGROUND OF THE INVENTION

Presently, aluminum metal is flash evaporated on the inside surfaces of a large screen projection system and more particularly on the inside surfaces of a "PRT" projection ray tube, in which the image is projected on opposite sides of the screen, using a tungsten wire filament having an aluminum pellet mounted on an open end of the tungsten wire filament. The PRT is placed over the tungsten filament and vacuum sealed prior to alumination. The tungsten filament is then heated to heat the aluminum pellet until flashing occurs. A projection ray tube is manufactured with a very small size diameter neck generally limited to about 24 mm. Because the neck is so small in size other known type of resistance heated flash evaporators including the resistance heated flash evaporator vessel or "flash evaporator vaporization boat", as it is sometimes referred to, are not currently useable as a substitute for the tungsten wire filament.

The conventional flash evaporator vessel or vaporization boat is a structure composed of intermetallic composite materials such as titanium diboride and boron nitride or a composite of titanium diboride, boron nitride and aluminum nitride. Alternatively the structure may be formed from a graphite body. The conventional flash evaporator vessel has a geometry preferably of rectangular configuration in which a cavity is machined to receive the metal charge to be vaporized. Ordinarily the flash evaporator vessel is placed in a vacuum chamber adjacent to the surface of the object to be coated and is connected at its opposite ends through a clamp to an external source of electrical power. Flashing of the metal charge requires good contact to be made to the clamp and equally important the current density generated in the evaporator vessel must be high enough to cause a sufficient hot zone to form across the cavity which will raise the metal charge in the cavity to its vaporization temperature.

For use in connection with a projection ray tube the flash evaporator vessel must be sized to fit inside the open neck of the PRT tube and provide sufficient current density to flash the metal charge. In addition the flash evaporator vessel should be configured to permit automatic pellet insertion into the vessel on an assembly line basis so that the same flash evaporator can be used repeatedly and reliably.

SUMMARY OF THE INVENTION

A vaporization vessel has been discovered in accordance with the present invention that will permit a metal charge of aluminum to be repeatedly flashed within a very confined area of, for example, a diameter of only 24 mm corresponding to the open neck size of a projection ray tube and to be readily attachable through a clamp to an external power source. The vaporization vessel of the present invention is designed to be introduced into the open neck of a projection ray tube and upon flashing will deposit a uniform coating of aluminum on the inside surfaces thereof.

In accordance with the preferred embodiment of the present invention the vaporization vessel is substantially horse shoe like in geometrical configuration having opposite sides and an upper section with the upper section having a recessed cavity adapted to receive the metal charge and two leg sections extending downwardly from the opposite sides of the vessel. The cross sectional dimension of each leg section nearest the recessed cavity is substantially smaller in size than the cross sectional dimension of each leg section as it recedes therefrom. The cross sectional dimension of each depending leg section adjacent the recessed cavity is preferably dimensionally smaller than the cross sectional dimension of each leg section as it recedes therefrom for at least a substantial distance along the length of each leg below said recessed cavity until the location of the holes in each leg section for connecting the vessel to an external source of power.

BRIEF DESCRIPTION OF THE DRAWINGS

Other advantages of the present invention will become apparent from the following detailed description of the invention when read in conjunction with the accompanying drawings of which:

FIG. 1 is a cross sectional view of the vaporization boat of the present invention;

FIG. 2 is a top view of the vaporization boat of FIG. 1, and

FIG. 3 is a side view of the vaporization boat of FIG. 1.

DETAILED DESCRIPTION OF THE INVENTION

A conventional vaporization boat or vessel of the resistance type is usually in a rectangular configuration which is dimensionally relatively long and narrow having a cavity or depression machined into one of its surfaces. The cavity may be of any desired geometry adapted to retain a charge of any suitable metal such as aluminum preferably in the form of a pellet. The opposite ends of the vaporization boat are connected to an external power supply through a clamp. The vessel provides a resistance path based upon the dimensions of the vessel and the resistivity. The vessel must be heated to a temperature sufficient to cause the metal charge in the cavity to flash. The size of the vessel becomes a serious design constraint for providing sufficient current density to cause flashing if it is to be miniaturized to fit into a confined area.

The vaporization vessel of the present invention is designed to overcome the design constraints of the prior art vessel configuration for applications where it is to be placed into a very small or confined area such as in the open neck of a projection ray tube having a neck size of only 24 mm in diameter as currently manufactured. The vaporization vessel 10 as shown in FIGS. 1–3 is constructed from a solid body of any suitable ceramic composition, preferably of an intermetallic binary composite such as titanium diboride and boron nitride or a tertiary composite of titanium diboride, boron nitride and aluminum nitride. Alternatively the vessel 10 may be composed of graphite and may also be coated with a deposit of pyrolytic boron nitride. The process of forming a pyrolytic coating of boron nitride is conventional and briefly involves introducing vapors of ammonia and a gaseous boron halide in a suitable ratio into a heated furnace reactor containing the vessel 10 to be coated. The furnace is maintained at a controlled temperature of between 1800° C. to 2200° C.

The vessel 10 has a horseshoe like configuration with an upper section 12 and two depending leg sections 14 and 15 respectively. The leg sections 14 and 15 extend downwardly from the opposite ends 16 and 17 of the upper section 12 and form an open slot 18 therebetween. The upper section 12 includes a cavity 19 formed therein preferably by machining a depression in the upper section 12 of the vessel 10 to any suitable depth. The cavity 19 may have any desired shape and its dimensions may vary, as needed, to serve as a flash receptacle for a suitable metal charge (not shown). The metal charge may be of any metal composition or alloy preferably selected from the group consisting of aluminum, copper, tin, silver and the like. The upper section 12 and cavity 19 is equivalent in configuration to that of a conventional flash evaporator vessel as shown, for example, in U.S. Pat. No. 5,239,612 the disclosure of which is herein incorporated by reference.

The depending leg sections 14 and 15 are preferably uniform in cross sectional dimension except for the sections 21 and 22 which must have a smaller cross sectional dimension than the cross sectional dimension of each of the leg sections 14 and 15 at any position along the length thereof at least up to the upper holes 25 of the leg sections 14 and 15 respectively. At least one hole 25 and preferably two holes 25 are formed in each leg section 14 and 15 for connecting the vessel 10 to an external source of power (not shown) and preferably by means of a clamp assembly screw (not shown). The holes 25 may all be equal in size and should expose the composite material or graphite underlying a coating, if any, of an insulator such as pyrolytic boron nitride before attachment of the vessel 10 to the conventional PRT clamp assembly. The external power supply (not shown) applies a suitable voltage across the upper section 12 and more specifically across the cavity 19 to cause flashing of the metal charge. By reducing the cross sectional dimension of each section 21 and 22 a relatively large open area 23 is formed between the recessed cavity 19 in the upper section 12 and the open slot 18. The width in cross section of the area 23 should be about equal to or slightly less than the width dimension of the cavity 19.

It has been discovered in accordance with the present invention that for a miniaturized size vessel the dimensional size of the sections 21 and 22 are critical to the performance of the vessel 10 and are essential to permit sufficient current density and a sufficiently long hot zone to be generated in the upper section of the vessel 10 so as to flash the metal charge in the cavity 19. The relative proportion of the dimensional size of the cross sectional area of each of the sections 21 and 22 to the cross sectional dimension of each leg section 14 and 15 along the length L measured from the open area 23 to the upper holes 25 will depend on the size of the vessel 10, the composition of the vessel 10 and the composition of the metal charge in the cavity 19. Accordingly the dimensional size of the sections 21 and 22 relative to the cross sectional dimension of each leg section 14 and 15 may vary substantially. The size of the vessel 10 shown in FIGS. 1–3 must be small enough for insertion with a metal charge of aluminum into a typical 24 mm open neck of a projection ray tube. The preferred dimensions for this application are: a width of 16 mm, a depth of 6 mm and an overall length (inclusive of the length of the leg sections) of 40 mm. The length L is 8 mm, the width of each leg section 14 and 15 is 7 mm, the width of slot 18 is 2 mm, the width of the open area 23 is 10 mm and the cross sectional area dimension of open area 23 is 40 $mm^2$. The width of the cavity 19 is 12 mm. The composition of the evaporator vessel 10 is preferably of a ceramic composite material of titanium diboride, boron nitride and aluminum nitride. The ratio of the reduced cross sectional dimension of the areas 21 and 22 to the cross sectional dimension of each leg section 14 and 15 below the areas 21 and 22 along the length L should be about 1:3 or greater to permit sufficient current density to be generated.

What we claim is:

1. A miniaturized vaporization vessel for flash evaporating a metal charge in a confined area comprising a solid body having a substantially horse shoe like geometrical configuration with opposite ends and an upper section, said upper section having a recessed cavity adapted to receive a metal charge to be vaporized and two depending leg sections extending downwardly from said opposite ends with the cross sectional dimension of each leg section nearest the recessed cavity being substantially smaller than the cross sectional dimension of each leg section as it recedes therefrom so as to form a large open area below the recessed cavity.

2. A miniaturized vaporization vessel as defined in claim 1 wherein said metal charge is selected from the group consisting of aluminum, copper, tin and silver.

3. A miniaturized vaporization vessel as defined in claim 2 wherein said solid body is composed of a ceramic composite selected from the class consisitng of: titanium diboride, boron nitride, aluminum nitride, pyrolytic boron nitride coated graphite and combinations thereof.

4. A miniaturized vaporization vessel as defined in claim 3 wherein the cross section of each leg section is uniform in dimension except in the areas thereof nearest the recessed cavity.

5. A miniaturized vaporization vessel as defined in claim 4 wherein the ratio of the cross sectional dimension of each leg section in the areas thereof nearest the recessed cavity relative to the otherwise uniform cross sectional dimension of each leg section is about 1:3 or greater.

6. A miniaturized vaporization vessel as defined in claim 5 wherein each leg section includes at least one hole adapted for connecting said vessel to an external source of power.

7. A miniaturized vaporization vessel as defined in claim 6 wherein each leg section has two holes therein spaced a predetermined distance apart for connecting said vessel to an external source of power.

8. A miniaturized vaporization vessel as defined in claim 4 wherein said large open area has a width substantially equal to the width of the recessed cavity.

\* \* \* \* \*